United States Patent [19]
Lin

[11] Patent Number: 5,888,865
[45] Date of Patent: Mar. 30, 1999

[54] METHOD FOR MANUFACTURING DRAM CAPACITOR

[75] Inventor: Benjamin Szu-Min Lin, Chiayi, Taiwan

[73] Assignee: United Microelectronics Corp., Taiwan

[21] Appl. No.: 55,686

[22] Filed: Apr. 6, 1998

[30] Foreign Application Priority Data

Jan. 14, 1998 [TW] Taiwan ................................ 87100406

[51] Int. Cl.⁶ ............................................. H01L 21/8242
[52] U.S. Cl. .......................... 438/253; 438/254; 438/396; 438/397
[58] Field of Search .................... 438/253, 254, 438/255, 256, 396, 397, 398, 399; 148/DIG. 14

[56] References Cited

U.S. PATENT DOCUMENTS

| | | | |
|---|---|---|---|
| 5,702,989 | 12/1997 | Wang et al. | 438/254 |
| 5,744,389 | 4/1998 | Kim | 438/254 |
| 5,763,304 | 6/1998 | Tseng | 438/254 |

*Primary Examiner*—Tuan H. Nguyen
*Attorney, Agent, or Firm*—Thomas, Kayden, Horstemeyer & Risley

[57] ABSTRACT

A method for manufacturing a DRAM capacitor whose lower electrode has a greater surface area, and is thereby able to increase the capacitance of the capacitor. The method comprises the steps of providing a substrate with a target conductive region and then depositing a first dielectric layer, an etching stop layer and a second dielectric layer sequentially over the target conductive region and the substrate. Next, a deep opening leading to the target conductive region is etched through the various layers, and a first conductive material is deposited to fill the deep opening completely. Thereafter, the second dielectric layer is patterned and etched to form a shallow opening exposing a portion of the first conductive layer and the etching stop layer. Then, a second conductive material is deposited into the exposed first conductive layer and etching stop layer. Finally, the second dielectric layer is removed, and then another dielectric layer and a third conductive layer are sequentially formed over the second conductive layer and the first conductive layer to complete the fabrication of the capacitor. In addition to increasing the surface area of the lower electrode, the capacitor of this invention has a small overall height measuring from the conductive layer to the substrate.

7 Claims, 7 Drawing Sheets

METHOD FOR MANUFACTURING DRAM CAPACITOR

CROSS-REFERENCE TO RELATED APPLICATION

This application claims the priority benefit of Taiwan application serial No. 87100406, filed Jan. 14, 1998, the full disclosure of which is incorporated herein by reference.

BACKGROUND OF THE INVENTION

1. Field of Invention

The present invention relates to a method for manufacturing a dynamic random access memory (DRAM) capacitor. More particularly, the present invention relates to a method for forming a lower electrode opening for a DRAM capacitor.

2. Description of Related Art

As the microprocessor of a computer becomes more powerful, the number of software programs that can be run by a computer simultaneously increase exponentially. Consequently, the amount of memory space necessary for storing digital data must also be increased. Therefore, highly efficient memory capacitors are in great demand. Accompanied by the increase in level of integration of DRAMs, a DRAM cell is now constructed from just one transfer field effect transistor and a storage capacitor. In general, a capacitor has an upper electrode and a lower electrode with a dielectric layer sandwiched between the two for providing the necessary dielectric constant. In addition, the capacitor is electrically coupled to a bit line, and reading and writing to and from the DRAM memory is achieved by charging or discharging the capacitor. Charging and discharging of the capacitor is carried out through the control of a transfer field effect transistor (TFET). The source terminal of the transfer transistor is connected to the bit line while the drain terminal of the transfer transistor is connected to the capacitor. The transfer transistor is switched on or off through a selection signal coming from a word line, which is electrically connected to the gate terminal of the transfer transistor. Hence, whether the capacitor is connected to the bit line allowing for charging or discharging of the capacitor depends upon the selection signal passed to the gate terminal.

Factors that affect the capacitance of a capacitor include: (1) the lower electrode; a lower electrode having a larger surface area will have more capacitance; (2) the dielectric constant of the dielectric layer; using a dielectric material having a higher dielectric constant to form a capacitor will increase its capacitance; and (3) the thickness of the dielectric layer; the thinner the dielectric layer, the higher its capacitance will be. Conventional DRAMs having storage capacity smaller than one megabits (Mbit) mostly have two-dimensional capacitors, commonly referred to as a planar type of capacitor. However, a planar type capacitor occupies lots of semiconductor substrate area, and so is unsuitable for use in high level integrated circuits. Highly integrated DRAM circuits, for example, those with memory having a storage capacity larger than about four Mbits, use three-dimensional capacitors. Three-dimensional capacitor constructs include the stacked type and the trench type.

Compared with a planar type of capacitor, a stacked type or a trench type of capacitor is able to provide the same capacitance to a capacitor despite a dimensional reduction. However, when the scale of integration for memory devices is further increased, for example. DRAM memory that stores up to 64 Mbit, even a simple three-dimensional capacitor construction is not enough.

One method of further increasing the surface area of the lower electrode, hence increasing the capacitance of a capacitor, is to develop horizontal extensions and then stacking them one over the other creating a fin-type of stacked capacitor. Another method is to allow the electrode and the dielectric film of the capacitor to extend vertically up to form a vertical structure called a cylindrical stack.

Yet, in the near future, the trend for integrating more and more devices into a wafer will continue, and the dimensions of a DRAM cell will shrink still further. As anybody familiar with the technology may well know, more reduction in memory cell dimensions will lead to a further reduction of the capacitance for its capacitor. One consequence of this is the production of more soft errors due to an increased effect by alpha rays. Therefore, people engaged in the semiconductor industry are still searching for ways to increase the capacitance of a capacitor though the available area is reduced.

In light of the foregoing, there is a need provide an improved method of fabricating DRAM capacitor.

SUMMARY OF THE INVENTION

Accordingly, the present invention is to provide a metal filling method for manufacturing DRAM capacitor that can increase the surface area of a lower electrode, and hence be able to increase the capacitance of a capacitor, as well as to lower the difference in height level between the metallic layer and the substrate.

To achieve these and other advantages and in accordance with the purpose of the invention, as embodied and broadly described herein, the invention provides a method for manufacturing a DRAM capacitor. The method comprises the steps of providing a substrate that has a target conductive region already formed thereon, and then depositing a first dielectric layer over the target conductive region and the substrate. Next, an etching stop layer is deposited over the first dielectric layer, and then a second dielectric layer is deposited over the etching stop layer. Thereafter, the second dielectric layer is patterned and then the etching stop layer and the first dielectric layer are etched sequentially until a deep opening exposing a portion of the target conductive region is formed. Subsequently, a first conductive layer is deposited into the opening and filled to the top. After that, the second dielectric layer is patterned and then etched to form a shallow opening exposing the surface of the first conductive layer and the surface of the etching stop layer. Next, a second conductive layer is deposited into the shallow opening covering the exposed first conductive layer and the exposed etching stop layer, and then the second dielectric layer is removed. Finally, a third dielectric layer is formed over the second conductive layer, and then a third conductive layer is deposited over the third dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention. and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
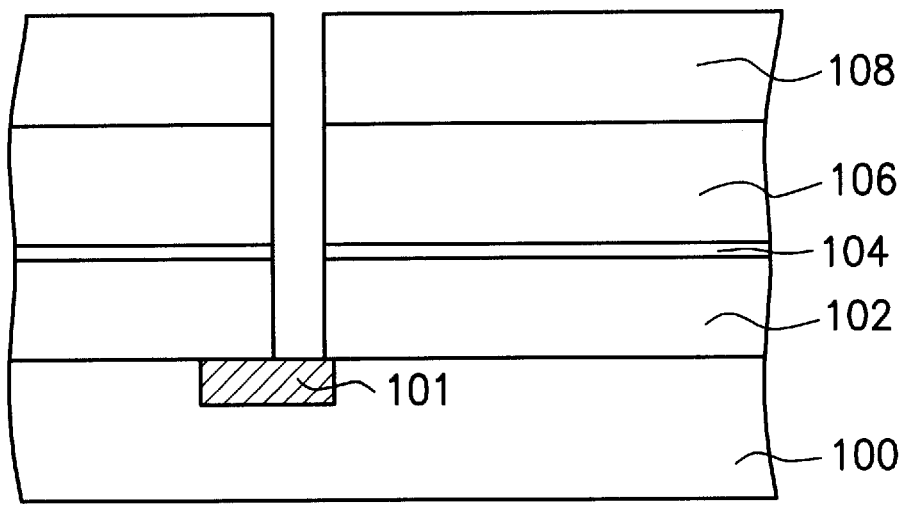
FIG. 1a through 1g are cross-sectional views showing the progression of manufacturing steps for producing a first type of DRAM capacitor according to the first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1a through 1g are cross-sectional views showing the progression of manufacturing steps for producing a first type of DRAM capacitor according to the first preferred embodiment of this invention. First, as shown in FIG. 1a, a substrate 100 having a MOS device formed thereon is provided. The MOS device is not drawn out in FIG. 1a, only a target conductive region 101, which is a source/drain region of the transistor, is shown. Next, a first dielectric layer 102 is formed over the substrate 100, and then an etching stop layer 104 is formed over the first dielectric layer 102. Thereafter, a second dielectric layer 106 is formed over the etching stop layer 104, and then a photoresist mask 108 is formed over the second dielectric layer 106. The first dielectric layer 102 and the second dielectric layer 106 can be an oxide layer, and the etching stop layer 104 can be a nitride layer, for example. Then, a photoresist mask 108 is formed over the second dielectric layer 106. Subsequently, the second dielectric layer 106, the etching stop layer 104 and the first dielectric layer 102 are etched sequentially using an etchant that does not have a high selectivity ratio between oxide and nitride. Finally, a deep opening exposing a portion of the target conductive region 101 is formed. The photoresist mask 108 is removed.

Figure 1B:
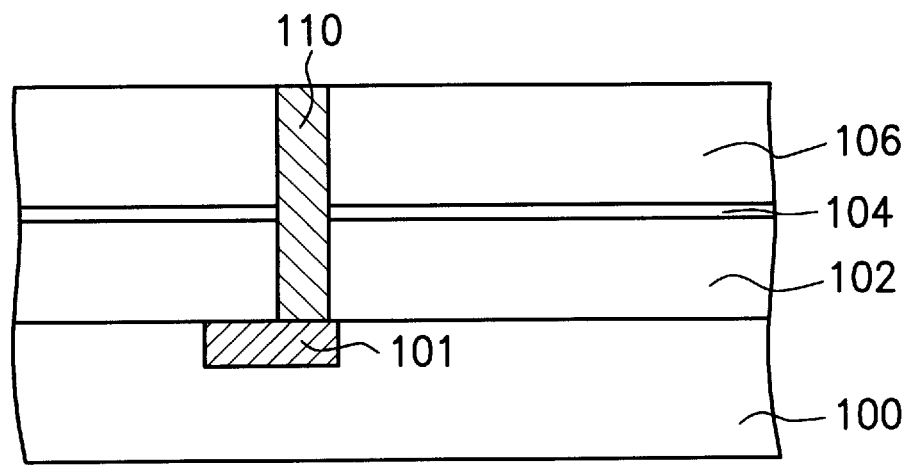

Next, as shown in FIG. 1b, a first conductive layer 110 is deposited into the deep opening filling the opening to the top. The first conductive layer 110 is formed from a substance selected from a group of conductive materials including polysilicon, titanium and tungsten.

Figure 1C:
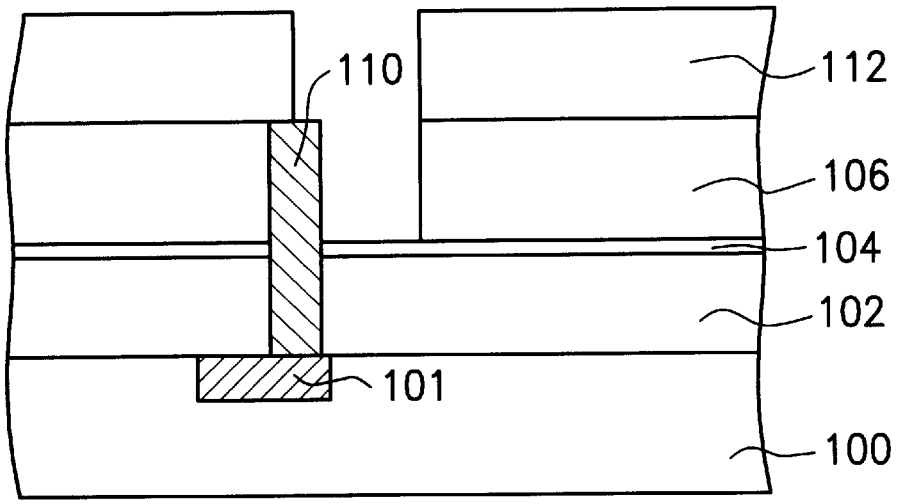
Figure 1D:
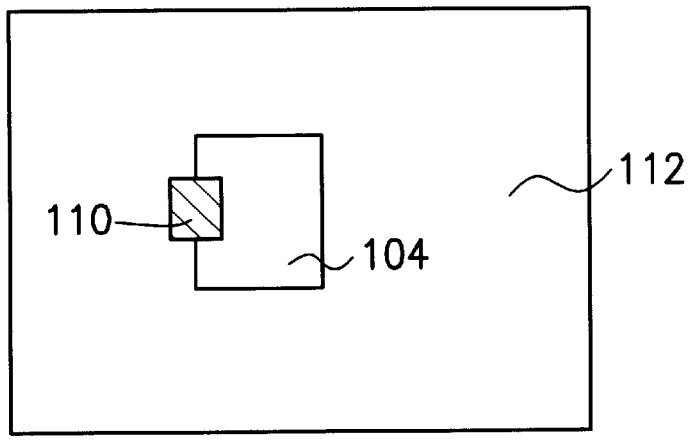

Next, as shown in FIG. 1c, a photoresist layer 112 is formed over second dielectric layer 106. The second dielectric layer 106 is etched using photoresist layer 112 as a patterning mask. The etching operation is carried out using an etchant that has a high etching selectivity ratio between the oxide and the nitride, and so the etching stop layer 104 can function as a processing end-point indicator. Finally, a shallow opening having a larger area coverage than the deep opening that exposes a portion of the first conductive layer 110 and a portion of the etching stop layer 104 is formed above the deep opening and the etching stop layer 104. FIG. 1d is a top view showing the same structure as shown in FIG. 1c.

Figure 1E:
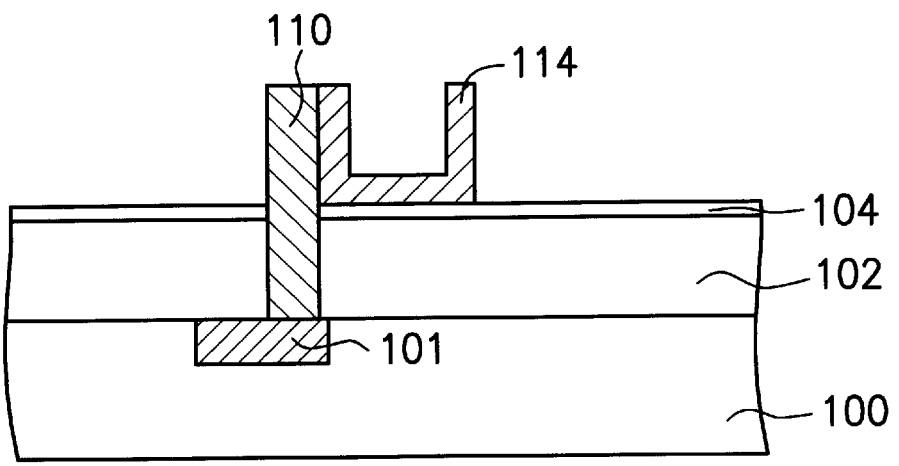

Next, as shown in FIG. 1e, a second conductive layer 114 is deposited into the shallow opening, wherein the second conductive layer 114 is formed from a substance selected from a group of conductive materials including polysilicon, titanium and tungsten. Thereafter the second dielectric layer 106 is removed. The first conductive layer 110 and the second conductive layer 114 together constitute the lower electrode of a capacitor.

Figure 1F:
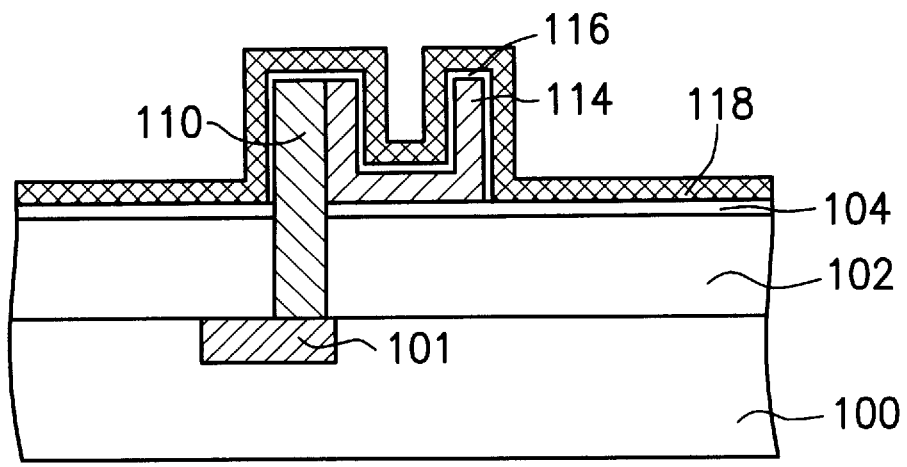
Figure 1G:
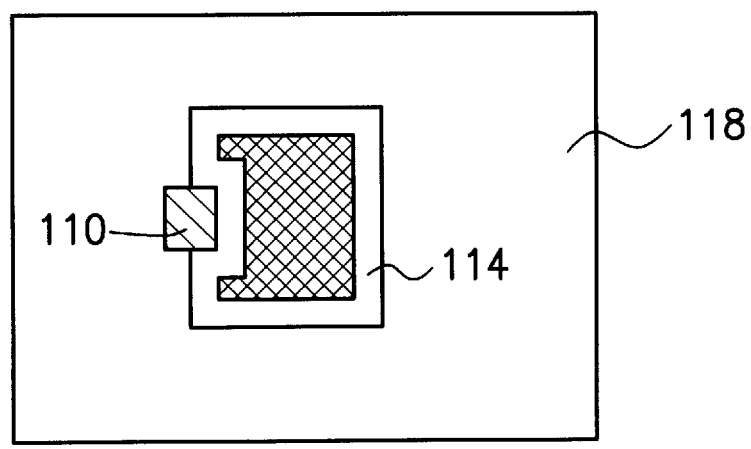

Next, as shown in FIG. 1f, a third dielectric layer 116 is formed over the lower electrode, wherein the third dielectric layer 116 is formed from a substance selected from a group of insulating materials including nitride and oxide. Finally, a third conductive layer 118 is deposited over the third dielectric layer 116 to complete the fabrication of the capacitor, wherein the third conductive layer 118 is formed from a substance selected from a group of conductive materials including polysilicon, titanium and tungsten. FIG. 1g is a top view showing the final structure as shown in FIG. 1f. Following the method of this invention, surface area of the lower electrode is increased. Moreover, since the second conductive layer is located on one side of the first conductive layer, height of the capacitor is small.

Figure 2A:
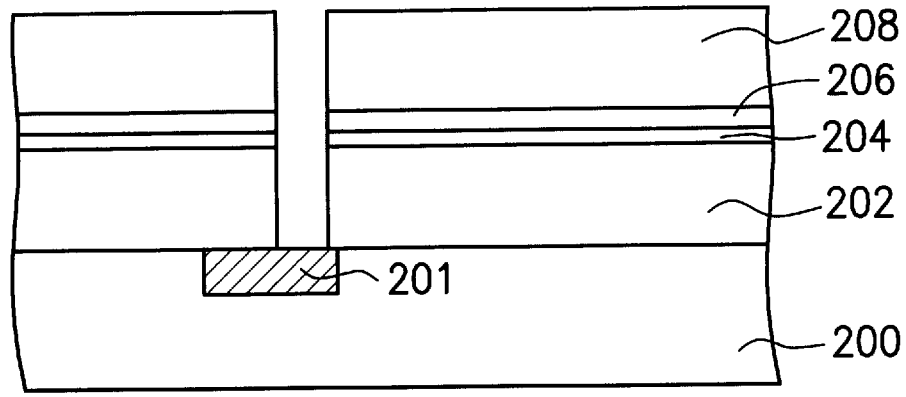
FIG. 2a through 2f are cross-sectional views showing the progression of manufacturing steps for producing a second type of DRAM capacitor according to a second preferred embodiment of this invention.

FIG. 2a through 2f are cross-sectional views showing the progression of manufacturing steps for producing a second type of DRAM capacitor according to second preferred embodiment of this invention. First, as shown in FIG. 2a, a substrate 200 having an MOS device formed thereon is provided. The MOS device is not drawn out in FIG. 2a, only a target conductive region 201, which is a source/drain region of the transistor, is shown. Next, a first dielectric layer 202 is formed over the substrate 200, and then an etching stop layer 204 is formed over the first dielectric layer 202. Thereafter, a second dielectric layer 206 is formed over the etching stop layer 204, and then a photoresist mask 208 is formed over the second dielectric layer 206. The first dielectric layer 202 and the second dielectric layer 206 can be oxide layers, and the etching stop layer 204 can be a nitride layer, for example. Then, a photoresist mask 208 is formed over the second dielectric layer 206. Subsequently, the second dielectric layer 206, the etching stop layer 204 and the first dielectric layer 202 are etched sequentially using an etchant that does not have a high selectivity ratio between oxide and nitride. Finally, a deep opening exposing a portion of the target conductive region 201 is formed. Later, the photoresist mask 208 is removed.

Figure 2B:
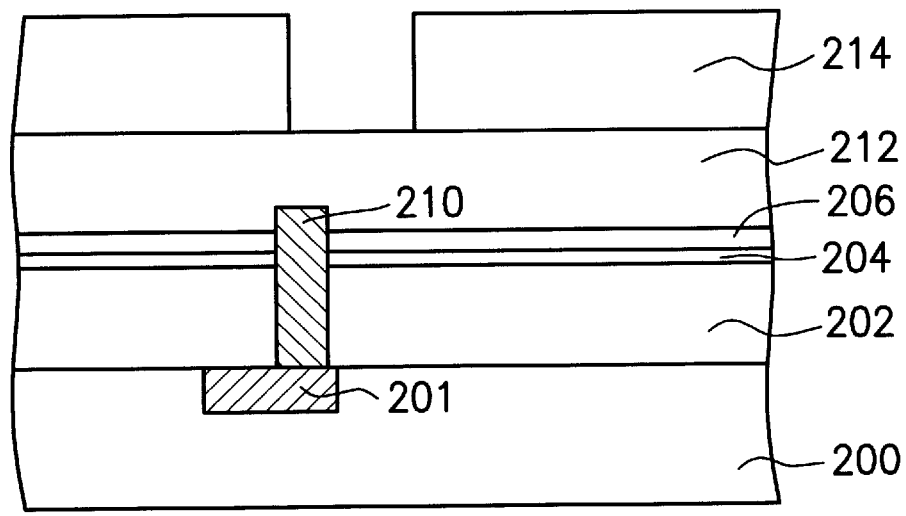

Next, as shown in FIG. 2b, a first conductive layer 210 is deposited into the deep opening filling the opening completely. The first conductive layer 210 is formed from a substance selected from a group of conductive materials including polysilicon, titanium and tungsten. After performing an etching back operation, the first conductive layer 210 still has a salient portion lying above the top surface of the second dielectric layer 206. Subsequently, a third dielectric layer 212 is formed over the second dielectric layer 206, and a photoresist layer 214 is formed over dielectric layer 212.

Figure 2C:
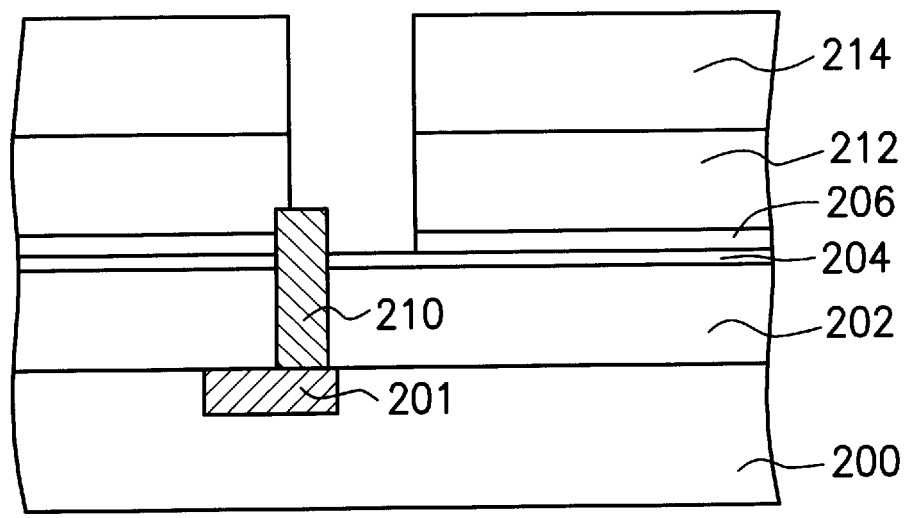

Next, as shown in FIG. 2c, the third dielectric layer 212 is etched using photoresist layer 214 as a patterning mask. The etching operation is carried out using an etchant that has a high etching selectivity ratio between the oxide and the nitride, and so the etching stop layer 204 can function as a processing end-point indicator. Finally, a shallow opening having a larger area coverage than the deep opening that exposes a portion of the first conductive layer 210 and a portion of the etching stop layer 204 is formed above the deep opening and the etching stop layer 204.

Figure 2D:
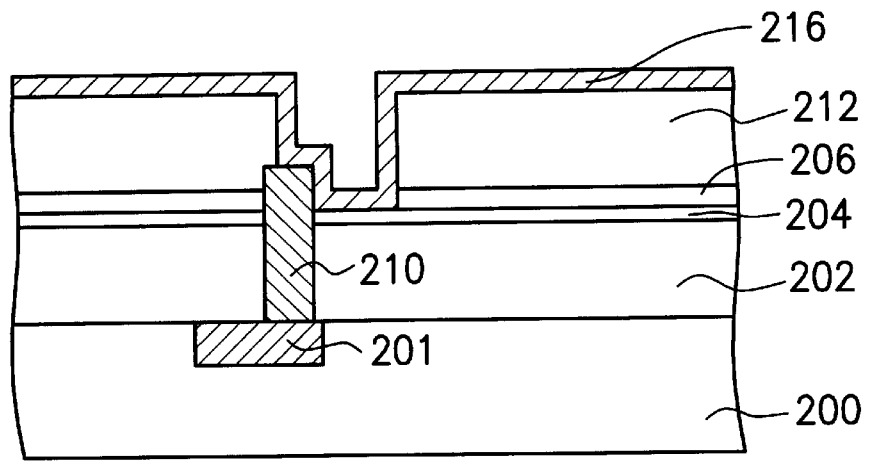
Figure 2E:
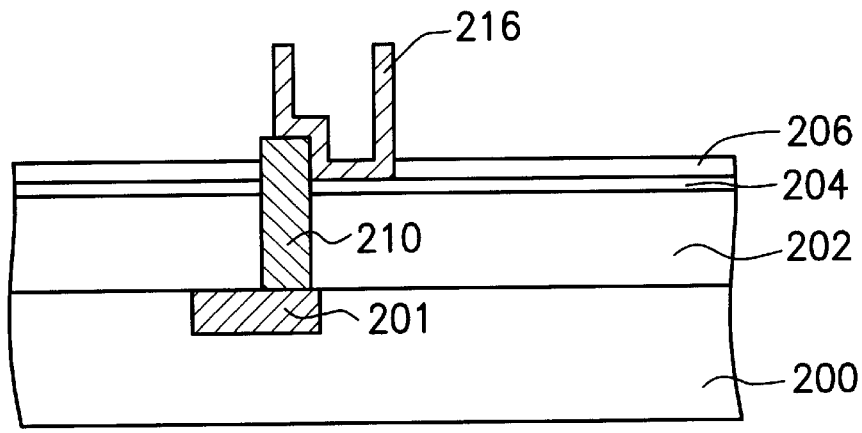

Next, as shown in FIG. 2d, a second conductive layer 216 is deposited into the shallow opening and on the surface of their dielectric layer 212, wherein the second conductive layer 216 is formed from a substance selected from a group of conductive materials including polysilicon, titanium and tungsten. Thereafter, all layers above the second dielectric layer 206 are removed. After the removal of the third dielectric layer 212, a structure as shown in FIG. 2e is formed. The first conductive layer 210 and the remainder of second conductive layer 216 together constitute the lower electrode of a capacitor.

Figure 2F:
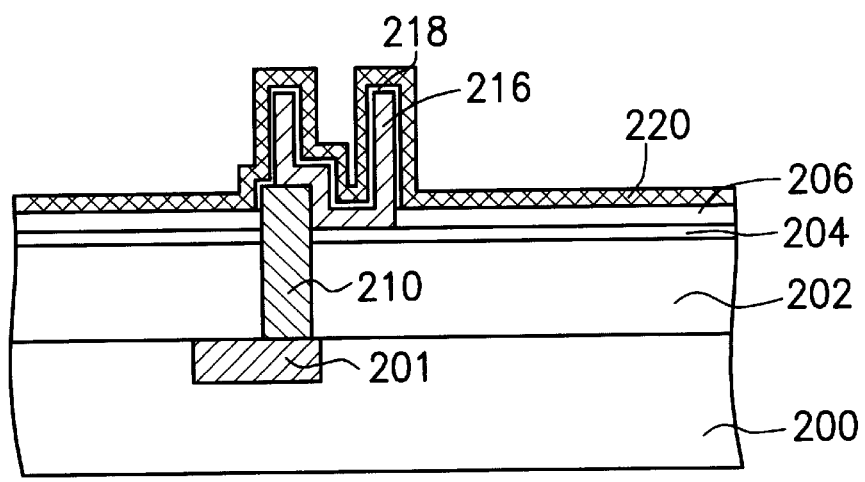

Next, as shown in FIG. 2f, a fourth dielectric layer 218 is formed over the lower electrode, wherein the fourth dielectric layer 218 is formed from a substance selected from a group of insulating materials including nitride and oxide. Finally, a third conductive layer 220 is deposited over the fourth dielectric layer 218 to complete the fabrication of the capacitor, wherein the third conductive layer 220 is formed from a substance selected from a group of conductive materials including polysilicon, titanium and tungsten. Following the method of this invention, surface area of the lower electrode is increased. Moreover, since the second conductive layer is located on one side of the first conductive layer, height of the capacitor is small.

Figure 3A:
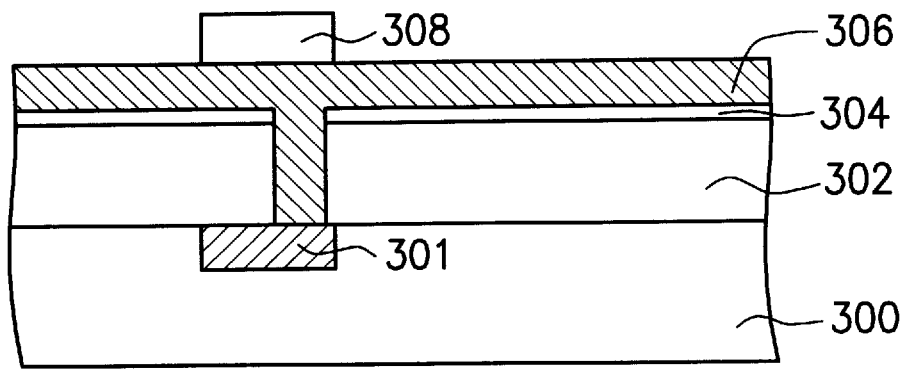
FIG. 3a through 3d are cross-sectional views showing the progression of manufacturing steps for producing a third type of DRAM capacitor according to the third preferred embodiment of this invention.

FIG. 3a through 3d are cross-sectional views showing the progression of manufacturing steps for producing a third type of DRAM capacitor according to the third preferred embodiment of this invention. First, as shown in FIG. 3a, a substrate 300 having an MOS device formed thereon is provided. The MOS device is not drawn out in FIG. 3a, only a target conductive region 301, which is a source/drain region of the transistor, is shown. Next, a first dielectric layer 302 is formed over the substrate 300, and then an etching stop layer 304 is formed over the first dielectric layer 302. Thereafter, a photoresist mask not shown is formed over the etching stop layer 304. the first dielectric layer 302 can be an oxide layer, and the etching stop layer 304 can be a nitride layer, for example. Then, the photoresist mask is used as a pattern for etching the etching stop layer 304 and the first dielectric layer 302 to form a deep opening exposing a portion of the target conductive region 301. Subsequently, a first conductive layer 306 is deposited into the deep opening, filling the opening completely and covering the surface of etching stop layer 304. The first conductive layer is formed from a substance selected from a group of materials including polysilicon, titanium and tungsten. Next, using a mask 308, the first conductive layer 306 is etched until the etching stop layer 304 is reached. After the etching operation, a salient portion of the first conductive layer 306 will remain on top of the etching stop layer 304.

Figure 3B:
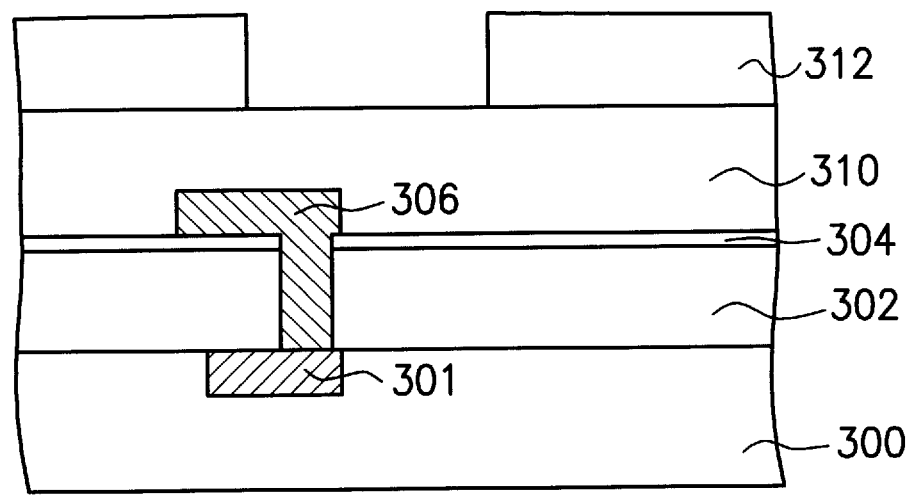

Next, as shown in FIG. 3b, a second dielectric layer 310 is formed over the etching stop layer 304 and the first conductive layer 306, wherein the second dielectric layer 310 can be an oxide layer, for example. Thereafter, a photoresist mask 312 is used as a pattern for etching the second dielectric layer 310 to form a shallow opening exposing a portion of the first conductive layer 306 and a portion of the etching stop layer 304.

Figure 3C:
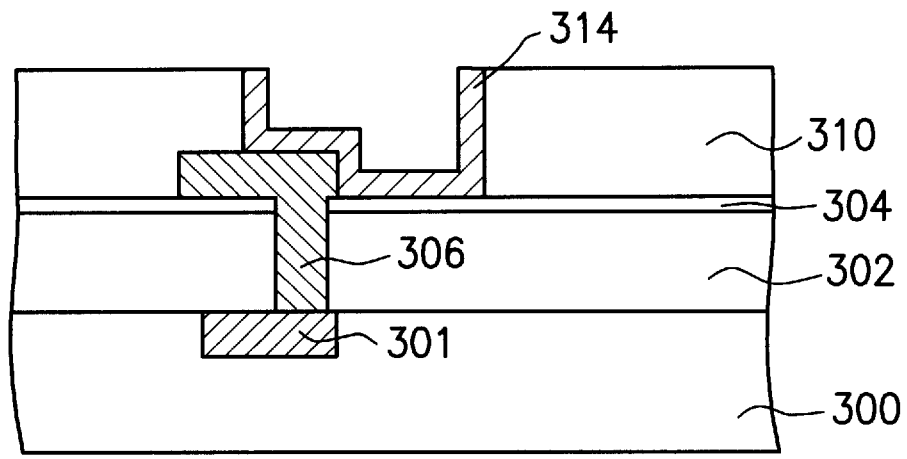
Figure 3D:
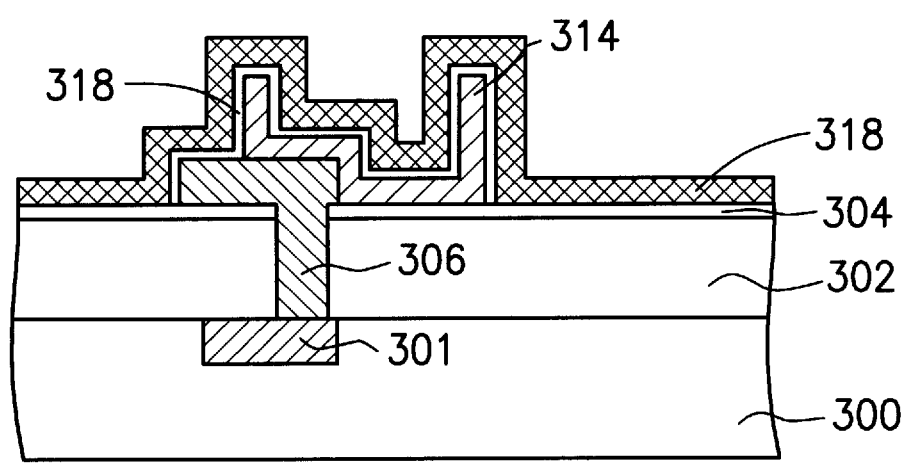

Next, as shown in FIG. 3c, a second conductive layer 314 is deposited into the shallow opening, wherein the second conductive layer 314 is formed from a substance selected from a group of conductive materials including polysilicon, titanium and tungsten. Thereafter, the second dielectric layer 310 is removed forming the structure as shown in FIG. 3d. The first conductive layer 306 and the second conductive layer 314 together constitute a lower electrode of a capacitor.

Next, as shown in FIG. 3d, a third dielectric layer 316 is formed over the lower electrode, wherein the third dielectric layer 316 is formed from a substance selected from a group of insulating materials including nitride and oxide. Finally, a third conductive layer 318, which functions as the upper electrode, is deposited over the third dielectric layer 316 to complete the fabrication of the capacitor. The third conductive layer 318 is formed from a substance selected from a group of conductive materials including polysilicon titanium and tungsten. Following the method of this invention, surface area of the lower electrode is increased. Moreover, since the second conductive layer is located on one side of the first conductive layer, height of the capacitor is small.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor, comprising:

providing a substrate that has a target conductive region formed thereon;

forming a first dielectric layer over the target conductive region and the substrate;

forming an etching stop layer over the first dielectric layer;

forming an second dielectric layer over the etching stop layer;

patterning the second dielectric layer and then etching the etching stop layer and the first dielectric layer to form a deep opening that exposes a portion of the target conductive region;

depositing a first conductive material into the deep opening and filling the opening completely to form a first conductive layer;

patterning the second dielectric layer to form a shallow opening exposing a portion of the first conductive layer and the etching stop layer;

depositing a second conductive material into the shallow opening to form second conductive layer that covers the exposed first conductive layer and the etching stop layer;

removing the second dielectric layer;

forming a third dielectric layer over second conductive layer;

depositing a third conductive material over the third dielectric layer to form third conductive layer.

2. The method of claim 1, wherein the target conductive region is a source/drain region in the substrate.

3. The method of claim 1, wherein before the step of patterning the second dielectric layer further includes depositing dielectric material over the substrate to form a dielectric layer.

4. The method of claim 1, wherein the step of forming the first dielectric layer or the second dielectric layer includes depositing oxide material.

5. The method of claim 1, wherein the step of forming the etching stop layer includes depositing nitride material.

6. The method of claim 1, wherein the step of forming the third dielectric layer includes depositing either oxide or nitride.

7. The method of claim 1, wherein the step of forming the first conductive layer, second conductive layer or the third conductive layer includes depositing polysilicon, titanium or tungsten.

* * * * *